(12) United States Patent
Schnabel et al.

(10) Patent No.: US 6,809,980 B2
(45) Date of Patent: Oct. 26, 2004

(54) LIMITER FOR REFRESH SIGNAL PERIOD IN DRAM

(75) Inventors: Joachim Schnabel, Munich (DE); Michael Hausmann, Unterhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/386,150

(22) Filed: Mar. 11, 2003

(65) Prior Publication Data

US 2004/0022103 A1 Feb. 5, 2004

(30) Foreign Application Priority Data

Mar. 28, 2002 (DE) ......................................... 102 14 102

(51) Int. Cl.$^7$ ................................................. G11C 7/00
(52) U.S. Cl. .................................. 365/222; 365/189.07
(58) Field of Search ........................... 365/222, 189.07, 365/185.25

(56) References Cited

U.S. PATENT DOCUMENTS

| | | | | |
|---|---|---|---|---|
| 4,716,551 A | * | 12/1987 | Inagaki ....................... | 365/222 |
| 5,532,968 A | | 7/1996 | Lee ............................. | 365/222 |
| 6,603,694 B1 | * | 8/2003 | Frankowsky et al. ....... | 365/222 |

FOREIGN PATENT DOCUMENTS

DE 195 02 557 A1 10/1995

OTHER PUBLICATIONS

P.J. Restle et al., "DRAM Variable Retention Time," IEEE, pp. 807–810 (Apr. 1992).

E. Schrüfer, *Elektrische Messtechnik* "Messung elektrischer and nichtelektrischer Grössen" mit 326 Bildern and 29 Tabellen, 2., verbesserte Auflage.

* cited by examiner

Primary Examiner—Tan T. Nguyen
(74) Attorney, Agent, or Firm—Fish & Richardson, PC.

(57) ABSTRACT

The invention relates to a device (10) for outputting a refresh signal for a memory cell of a semiconductor memory device, the device (10) comprising:

a receiving device for receiving a variable periodic refresh input signal (14);

a comparison device (22) for comparing the period duration of the refresh input signal (14) with at least one predeterminable value;

an output device (22) for outputting a refresh output signal (24) in a manner dependent on the result of the comparison in the comparison device (22);

the output device (22) being designed in such a way that if the period duration of the refresh input signal (14) lies above a predeterminable maximum value, a refresh output signal (24) with the predeterminable maximum period duration (T_max) can be output and/or if the period duration of the refresh input signal (14) lies below a predeterminable minimum value, a refresh output signal (24) with a predeterminable minimum period duration (T_min) can be output, and otherwise a refresh output signal (24) can be output whose period duration (T_out) is proportional to the period duration (T_in) of the refresh input signal (14).

Furthermore, the invention relates to a method for outputting a refresh signal for a memory cell of a semiconductor memory device.

13 Claims, 2 Drawing Sheets

LIMITER FOR REFRESH SIGNAL PERIOD IN DRAM

DESCRIPTION

The present invention relates to a device and a method for outputting a refresh signal for a memory cell of a semiconductor memory device, which is preferably a DRAM memory.

BACKGROUND

The memory cells of DRAM semiconductor memory devices must be periodically refreshed or updated in order to prevent a loss of data. Devices for outputting a refresh signal for a memory cell of DRAM memories are known which make it possible to adapt the frequency of the refresh signal to altered temperature conditions. However, these devices have the disadvantage that the refresh frequency can be adapted only inadequately to the refresh requirements of the memory cell.

SUMMARY

For this reason, it is an object of the present invention to provide a device and a method for outputting a refresh signal for a memory cell of a semiconductor memory device which make it possible to adapt a better control of the refresh frequency or refresh period duration in a wide temperature range.

The invention provides a device for outputting a refresh signal for a memory cell or a memory cell array of a semiconductor memory device, the device comprising:

- a receiving device for receiving a variable periodic refresh input signal;
- a comparison device for comparing the period duration of the refresh input signal with at least one predeterminable value;
- an output device for outputting a refresh output signal in a manner dependent on the result of the comparison in the comparison device;
- the output device being designed in such a way that if the period duration of the refresh input signal lies above a predeterminable maximum value, a refresh output signal with the predeterminable maximum period duration can be output, and/or
- if the period duration of the refresh input signal lies below a predeterminable minimum value, a refresh output signal with a predeterminable minimum period duration can be output, and
- otherwise a refresh output signal can be output whose period duration corresponds to the period duration of the refresh input signal or is proportional thereto.

The provision of a maximum and/or minimum period duration for the refresh output signal makes it possible to define an upper and/or lower period duration value for the refresh output signal. What can be achieved by the provision of an upper limit for the period duration of the refresh output signal is that a refresh signal is output to the memory cell of the semiconductor memory device within a predeterminable maximum period of time even if the refresh input signal would provide a longer period of time.

Furthermore, the lower limitation of the period duration of the refresh signal makes it possible to prevent an excessively frequent and thus unnecessary refreshing of the memory cell.

Preferably, the output device is furthermore designed for outputting a reset signal.

In a preferred embodiment, the period duration of the refresh input signal is temperature-dependent.

The provision of an upper and a lower limit for the period duration of the refresh output signal makes it possible to achieve a better adaptation of the refresh output signal to the temperature gradient of the refresh input signal. Consequently, if a temperature-dependent refresh output signal (i.e. a refresh output signal with a temperature-dependent refresh period or frequency) is output, a greater slope of the curve of the refresh output signal can be achieved since the curve limitation at the top and bottom means that safety margins are no longer necessary.

The memory cell is preferably a DRAM memory cell or a memory cell of a dynamic semiconductor memory.

The refresh input signal is preferably a clock signal.

In a preferred embodiment, the device according to the invention furthermore comprises a measuring device for determining the period duration of the refresh input signal.

The measuring device preferably comprises a counter.

Preferably, the predeterminable minimum and/or maximum period duration is generated by means of a temperature-independent periodic signal and at least one counter.

In a preferred embodiment, the counters comprise multivibrators or flip-flops.

The present invention furthermore provides a method for outputting a refresh signal for a memory cell of a semiconductor memory device, the method comprising the following steps:

- reception of a variable periodic refresh input signal;
- comparison of the period duration of the refresh input signal with at least one predeterminable value;
- outputting of a refresh output signal in a manner dependent on the result of the comparison in the comparison device;

in which case

- if the period duration of the refresh input signal lies above a predeterminable maximum value, a refresh output signal with the predeterminable maximum period duration is output, and/or
- if the period duration of the refresh input signal lies below a predeterminable minimum value, a refresh output signal with a predeterminable minimum period duration is output, and
- otherwise a refresh output signal is output whose period duration corresponds to the period duration of the refresh input signal or is proportional thereto.

Preferably, the method furthermore comprises a step of determination of the period duration of the refresh input signal by means of a measuring device.

In a preferred embodiment, the method furthermore comprises a step of outputting of a reset signal.

BRIEF DESCRIPTION OF THE DRAWINGS

Further objects, features and advantages of the present invention will become apparent from the exemplary description of a preferred embodiment with reference to the drawings, in which.

DETAILED DESCRIPTION

Figure 1:
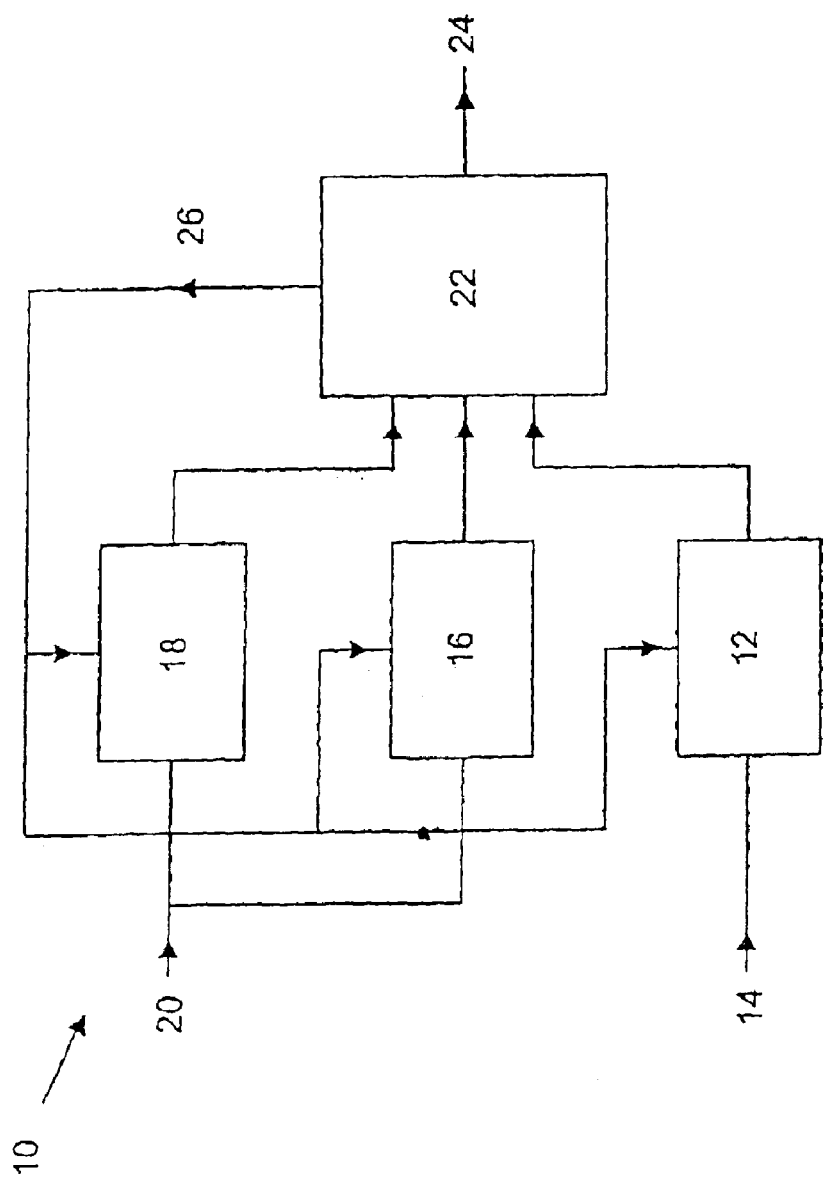
FIG. 1 shows a schematic view of a device according to a preferred embodiment of the present invention.

FIG. 1 shows a schematic view of a device in accordance with a preferred embodiment of the present invention.

The device 10 comprises an input for a temperature-dependent clock signal or refresh input signal 14 having a temperature-dependent period duration T_in and an input for a temperature-independent clock signal 20 having a constant period duration T_const. Furthermore, the device comprises an output for an output clock signal or refresh output signal 24 having a period duration T_out. It is likewise conceivable that the input signals and the output signal have a different periodic form and need not necessarily be clock signals. The refresh output signal 24 is preferably a refresh signal for memory cells of a DRAM memory.

The refresh input signal 14 is preferably the output signal of a device (not shown) which converts a temperature-dependent value, e.g. a current or a voltage, into a temperature-dependent clock signal. In this case, the period duration T_in of the clock signal obtained is dependent on the temperature. The period duration T_in of the clock signal is preferably longer for lower temperatures and shorter for higher temperatures.

Furthermore, the device 10 comprises a refresh input signal counter 12 for determining the period duration of the temperature-dependent refresh input signal 14, a maximum value counter 16 for determining the upper limit T_max of the period duration T_out of the refresh output signal 24 and a minimum value counter 18 for determining the lower limit T_min of the period duration T_out of the refresh output signal 24.

The values T_min and T_max are preferably defined as follows. A so-called nominal period duration T_nom of the refresh output signal 24 is used as a starting point. This corresponds to the period duration of the temperature-dependent refresh output signal 24 in the optimum operating range. T_min is preferably defined to 0.5 T_nom and T_max to 2 T_nom.

The counters 12, 16 and 18 preferably comprise bistable multivibrators or flip-flops.

Furthermore, the device 10 according to the invention comprises a logic unit 22 for comparing the counter readings of the counters 12, 16 and 18, respectively, and outputting a refresh output signal 24 and a reset signal 26 for resetting the counters 12, 16 and 18.

In a preferred embodiment, the device 10 may comprise a memory for storing the maximum count of the maximum value counter 16 and minimum count of the minimum value counter 18.

The operation of the device 10 according to the invention in accordance with a preferred embodiment of the present invention is described below with reference to FIGS. 1 and 2.

Figure 2:
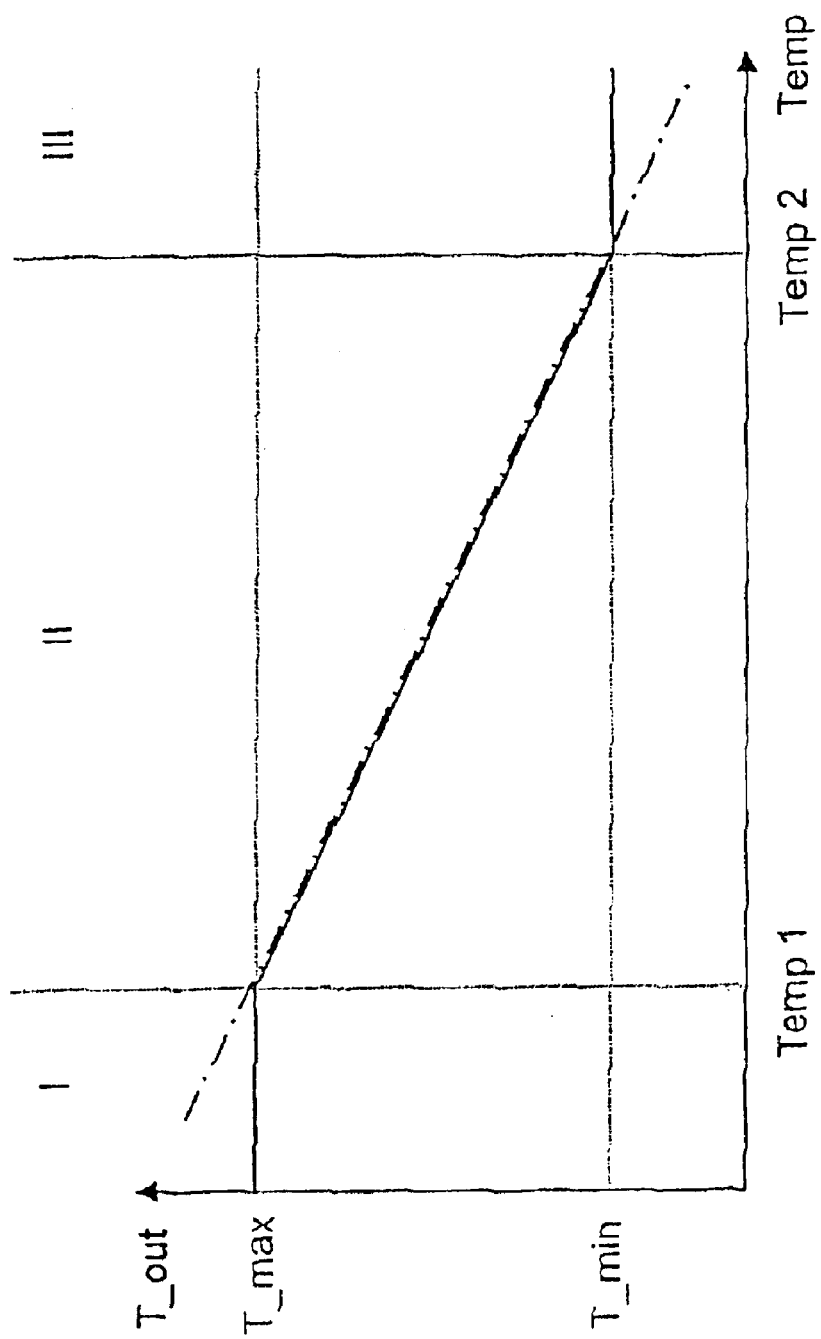
FIG. 2 shows the profile of the period duration T_out of the refresh output signal as a function of the temperature Temp in accordance with a preferred embodiment of the present invention.

FIG. 2 shows the profile of the period duration T_out of the refresh output signal 24 as a function of the temperature Temp. In this case, the profile of the solid line corresponds to the profile of the refresh output signal 24 in accordance with a preferred embodiment of the present invention. The dash-dotted line shows the profile of the refresh output signal 24 if a refresh signal is generated without using the device 10 according to the invention.

The refresh input signal counter 12 counts the clock cycles of the refresh input signal 14 up to a predeterminable value. The maximum value counter 16 counts the clock cycles of the temperature-independent clock signal 20 up to a maximum predeterminable value and minimum value counter 18 counts the clock cycles of the temperature-independent clock signal 20 up to a minimum predeterminable value. The logic unit 22 compares the readings of the counters 12, 16 and 18, i.e. whether or not the counters 12, 16 and 18 have counted through or counted up to the respective predeterminable value.

The refresh output signal 24 is dependent on which of the counters 12, 16 and 18 have counted through, and in what order the counting through terminated. The different cases are discussed below.

If the minimum value counter 18 has counted through first, i.e. if the frequency of the refresh input signal 14 lies below a predeterminable maximum frequency or the period duration T_in of the refresh input signal 14 lies above a predeterminable minimum value, the refresh output signal 24 is dependent on whether the refresh input signal counter 12 or the maximum value counter 16 has counted through next.

If the maximum value counter 16 has counted through as second counter up to its predeterminable value, i.e. if the period duration of the refresh input signal 14 lies above a predeterminable maximum value, the logic unit 22 outputs an output pulse as refresh output signal 24 at the point in time when the maximum value counter 16 has counted through. This state corresponds to the region I in FIG. 2.

By contrast, if the refresh input signal counter 12 has counted through as second counter up to its predeterminable value, i.e. if the period duration T_in of the refresh input signal 14 lies below a predeterminable maximum value, the logic unit 22 outputs an output pulse as refresh output signal 24 at the point in time when the refresh input signal counter 12 has counted through. This state corresponds to the region II in FIG. 2.

If the refresh input signal counter 12 has counted through first and the minimum value counter 18 has subsequently counted through, i.e. if the period duration T_in of the refresh input signal 14 is smaller than the predeterminable minimal value, the logic unit 22 outputs an output pulse as refresh output signal 24 at the point in time when the minimum value counter 18 has counted through. This state corresponds to the region III in FIG. 2.

At the same time as the refresh output signal 24, a reset signal 26 is output, as a result of which the counters 12, 16 and 18 are reset.

As can be seen in FIG. 2, without the use of the device 10 according to the invention (dash-dotted profile in FIG. 2), the period duration T_out of the refresh output signal 24 lies above a predeterminable maximum period duration T_max if a predeterminable temperature Temp1 is undershot. This means that a refresh output signal 24 for a memory cell would be output too infrequently or would no longer be output at all. The consequence of this is that the memory cell would no longer be refreshed or updated often enough. In order to avoid this, according to the present invention, a refresh output signal 24 with a predeterminable maximum period duration T_max is output for this temperature range (region I in FIG. 2).

As can furthermore be seen in FIG. 2, without the use of the device 10 according to the invention (dash-dotted profile in FIG. 2), the period duration T_out of the refresh output signal 24 lies below a predeterminable minimum period duration T_min if the temperature exceeds a predeterminable maximum value Temp2. This means that a refresh output signal 24 for the memory cell would be output more often than necessary. In order to avoid this, a refresh output signal 24 with a predeterminable minimum period duration T_min is output for this temperature range (region III in FIG. 2).

A refresh output signal 24 with a temperature-dependent period duration T_out is output for the temperature range between Temp1 and Temp2 (region II in FIG. 2). The profile of the refresh output signal 24 in the temperature-dependent region II need not necessarily be linear. It is likewise conceivable for the curve to have a curved profile in this region.

What is claimed is:

1. A circuit for outputting a refresh signal for a memory cell, the circuit comprising:
    a receiving device for receiving a refresh input signal, the refresh input signal having a variable period;
    a comparison device in communication with the receiving device for comparing the variable period with a predeterminable duration;
    an output device in communication with the comparison device for outputting a refresh output signal having a period that depends on a comparison between the variable period and the predeterminable duration;
    the output device being configured such that
        if the variable period is longer than a predeterminable maximum duration, the refresh output signal has a period equal to the predeterminable maximum duration,
        if the variable period is shorter than a predeterminable minimum duration, the refresh output signal has a period equal to the predeterminable minimum duration, and
        if the variable period is between the predeterminable minimum and maximum durations, the refresh output signal has a period that is proportional to the variable period.

2. The circuit of claim 1, wherein the output device is configured to output a reset signal.

3. The circuit of claim 1, wherein the receiving device is configured to receive a refresh input signal having a variable period that depends on temperature.

4. The circuit of claim 1, wherein the memory cell comprises a DRAM memory cell.

5. The circuit of claim 1, wherein the receiving device is configured to receive a clock signal.

6. The circuit of claim 1, wherein the receiving device comprises a measuring device for determining the variable period.

7. The circuit of claim 6, wherein the measuring device comprises a counter.

8. The circuit of claim 1, further comprising a counter configured to generate one of the predeterminable minimum period duration and the predeterminable maximum period duration on the basis of a temperature independent periodic signal.

9. The circuit of claim 8, wherein the counter comprises a multivibrator.

10. A DRAM memory having a memory cell configured to receive a refresh signal from the circuit according to claim 1.

11. A method for outputting a refresh signal to a memory cell, the method comprising:
    receiving a refresh input signal having a variable period;
    comparing the variable period with a predeterminable duration; and
    outputting a refresh output signal having
        a period equal to a predeterminable maximum duration, if the variable period is longer than the predeterminable maximum duration,
        a period equal to a predeterminable minimum duration, if the variable period is shorter than the predeterminable minimum duration, and
        a period that is proportional to the variable period, if the variable period is between the predeterminable minimum and maximum durations.

12. The method of claim 11, further comprising determining the variable period with a measuring device.

13. The method of claim 11, further comprising outputting a reset signal.

* * * * *